United States Patent [19]
Shi et al.

[11] Patent Number: 6,143,142
[45] Date of Patent: Nov. 7, 2000

[54] COMPOSITE COATINGS

[75] Inventors: Xu Shi; Hong Siang Tan; Beng Kang Tay, all of Singapore, Singapore

[73] Assignee: Nanyang Technological University, Singapore, Singapore

[21] Appl. No.: 09/336,753

[22] Filed: Jun. 21, 1999

[30] Foreign Application Priority Data

May 10, 1999 [GB] United Kingdom .................. 9910842

[51] Int. Cl.$^7$ ........................ C23C 14/34; C23C 14/22
[52] U.S. Cl. .............................. 204/192.16; 204/192.38; 204/192.15; 204/192.17; 204/192.22; 204/192.25; 204/192.27; 204/192.12; 427/562; 427/563; 427/564; 427/569; 427/576; 427/577; 427/578; 427/580; 427/902; 427/906; 427/571
[58] Field of Search ................... 204/192.38, 192.15, 204/192.17, 192.22, 192.25, 192.27, 192.16, 192.12; 427/562, 563, 564, 569, 576, 577, 578, 580, 902, 906, 571

[56] References Cited

U.S. PATENT DOCUMENTS

| 3,428,541 | 2/1969 | Froemel et al. | 204/192.38 |
|---|---|---|---|
| 4,839,011 | 6/1989 | Ramalingam et al. | 204/192.38 |
| 4,842,710 | 6/1989 | Freller et al. | 204/192.38 |
| 6,031,239 | 2/2000 | Shi et al. | 250/492.21 |

FOREIGN PATENT DOCUMENTS

| 5-106022 | 4/1993 | Japan . |
|---|---|---|
| WO 96/26531 | 8/1996 | WIPO . |
| WO 96/26532 | 8/1996 | WIPO . |

OTHER PUBLICATIONS

Martin, P.J., et al., "Structure and hardness of diamond–like carbon films prepared by arc evaporation," *J. Mater. Sci. Lett.* 7:410–412 (1988) (Month Unknown).

McKenzie, D.R., et al., "Compressive–Stress–Induced Formation of Thin–Film Tetrahedral Amorphous Carbon," *Phys. Rev. Lett.* 67:773–776 (Aug. 1991).

Schwan, J., et al., "Raman spectroscopy on amorphous carbon films," *J. Appl. Phys.* 80:440–447 (Jul. 1996).

Dimigen, H., et al., "Tribological and electrical properties of metal–containing hydrogenated carbon films," *Appl. Phys. Lett.* 50:1056–1058 (Apr. 1987).

Fallon, P.J., et al., "Properties of filtered–ion–beam–deposited diamondlike carbon as a function of ion energy," *Phys. Rev. B* 48:4777–4782 (Aug. 1993).

Kumbhar, A.S., et al., "Growth of clean amorphous silicon–carbon alloy films by hot–filament assisted chemical vapor deposition technique," *Appl. Phys. Lett.* 66:1741–1743 (Apr. 1995).

(List continued on next page.)

*Primary Examiner*—Alan Diamond
*Attorney, Agent, or Firm*—Sterne, Kessler, Goldstein & Fox P.L.L.C.

[57] ABSTRACT

The invention describes composite coatings, in particular comprising carbon and another metallic element such as silicon or aluminium. These coatings have improved properties compared with pure tetrahedral amorphous carbon coatings, in that they have reduced stress levels and can be deposited at higher thicknesses, whilst retaining acceptable hardness and other useful mechanical properties. Also described are methods of making composite coatings, materials for making the coatings and substrates coated therewith. Specifically, a method of applying a coating to a substrate using a cathode arc source, comprises generating an arc between a cathode target and an anode of the source and depositing positive target ions on the substrate to form the coating, wherein the coating is a composite of at least first and second elements and the target comprises said at least first and second elements. A composite coating comprises tetrahedral amorphous carbon and a metallic element other than carbon, the composite coating having an $sp^3$ content of at least 60%. A target for use in a cathode arc source comprises a mixture of carbon and a metallic element other than carbon.

9 Claims, 12 Drawing Sheets

OTHER PUBLICATIONS

Zhang, X., et al., "Optical study of silicon–containing amorphous hydrogenated carbon," *J. Appl. Phys.* 83:2620–2625 (Mar. 1998).

Wei, Q., et al., "Improvement of wear resistance of pulsed laser deposited diamond–like carbon films through incorporation of metals," *Mater. Sci. Engin.* B53:262–266 (1998) (Month Unknown).

Xu, S., et al., "Properties of carbon ion deposited tetrahedral amorphous carbon films as a function of ion energy," *J. Appl. Phys.* 79:7234–7240 (May 1996).

Xu, S., et al., "Mechanical properties and Raman spectra of tetrahedral amorphous carbon films with high $sp^3$ fraction deposited using a filtered cathodic arc," *Philos. Mag. B* 76:351–361 (1997) (Month Unknown).

Stress (Gpa) versus Hardness (Gpa)

COMPOSITE COATINGS

The present invention relates to composite coatings, in particular such coatings comprising carbon and another metallic element. The present invention relates also to methods of making composite coatings, materials for making the coatings and substrates coated with the coatings.

Amorphous silicon-carbon alloys (a-$Si_{1-x}C_x$) have attracted much recent attention not only due to the composition dependent variability of their optical band gap but also because of their important role as intermediate layers for the growth of diamond films on crystalline silicon and non-diamond substrate. Several attempts have been made to deposit (a-$Si_{1-x}C_x$) films using existing thermal chemical vapour deposition (CVD) or plasma assisted CVD techniques, but these techniques involve high deposition temperatures which may destroy or damage many substrate materials. Also, known CVD techniques have used metal organic compounds, undesirable due to their toxicity.

It is known to deposit hard thin films, such as tetrahedral amorphous carbon (ta-C), using a filtered cathode arc (McKenzie et al 1991, Fallon et al 1993, Martin et al 1988). These ta-C films have interesting and useful properties, such as extreme hardness (~70 Gpa), thermal stability, high electrical resistivity, wide Tauc optical band gap (~2.5 eV), smooth surface and low friction, and transparency in wide spectral range because of the high $sp^3$ fraction of carbon atoms (up to 87%) in the film.

However, the high internal stress in the films can limit their applications, especially when it is desired to deposit a relatively thick film, as the film may flake away from the substrate.

In order to reduce the internal stress of ta-C films, and in an attempt to improve adhesion of thick films of this type, different modifications have been made, such as nitrogen incorporation into the films. However, whilst the internal stress can be reduced a little, this is not sufficient to enable significant increases in usable film thickness. In addition, there are disadvantages to incorporation of nitrogen into these films as so doing can harm many of the mechanical properties of the films.

Metal-containing diamond-like-carbon (DLC) materials are known potentially to have useful electrical and mechanical properties, wear resistance and friction (Dimigen et al 1987). It has been reported that such films containing certain low percentages of metals can have comparable wear resistance and friction coefficient with the a-C:H films, and may have better adhesion to the substrate. Introducing certain metal elements such as aluminum into the DLC films may reduce film stress, but only at the unacceptable expense of its mechanical properties, such as hardness and Young's modulus.

It is therefore an object of the invention to provide composite coatings that solve or at least ameliorate the aforementioned problems. In particular it is an object of specific embodiments of the invention to provide composite coatings that exhibit reduced stress, thus enabling deposition of relatively thick coatings whilst retaining acceptable hardness.

Accordingly, the present invention provides, in a first aspect, a method of applying a coating to a substrate using a cathode arc source, comprising generating an arc between a cathode target and an anode of the source; and depositing positive target ions on the substrate to form the coating, wherein the coating is a composite of at least first and second elements and the target comprises said at least first and second elements.

Thus, the invention enables the production of composite coatings from targets used in a cathode arc that contain two or more coating components. It is an advantage of the method that composite films can easily be produced using the filtered cathode arc process, and without the need for introduction of gaseous compounds into the arc vacuum chamber. Composite films were previously made using, for example, a graphite target and hydrocarbon gas, $SiH_4$ gas or a metal organic compound in vapour form introduced typically close to the substrate. The resultant films had high hydrogen content and suffered from poor mechanical properties. The method of the invention avoids the necessity for gaseous components and enables production of films that have lower hydrogen contents than and improved mechanical properties than possible hitherto. Films of the invention typically have a hydrogen content of 20% or less, preferably 10% or less, and in specific embodiments of the invention substantially hydrogen-free coatings are produced.

It is a further option for the method to deposit a coating that is a composite of at least first, second and third elements and wherein the target comprises said at least first, second and third elements. Alternatively, the coating can be a composite of at least first, second and third elements and the target comprises said at least first and second elements and the method comprises introducing the third element into the coating in a gaseous or liquid form.

It is envisaged that the method of the invention is of application without limit to the choice of target materials. Specifically, the method has successfully been carried out using a target that comprises carbon, producing a coating of a composite comprising tetrahedral amorphous carbon. The target preferably contains, as second element, a metal other than carbon. The target should be electrically conducting, so other target materials may be chosen that are non-metallic, provided that the target is sufficiently conducting to be used as a cathode target in a cathode arc deposition apparatus. Where the second element is a metal it is suitable selected from titanium, nickel, chrome, aluminum, silicon and tungsten. Reference to element is intended to be reference to the element whether present in elemental or ionic or compound form.

In a particularly preferred embodiment of the invention the method comprises depositing a layer of a composite film of carbon and silicon, suitably using a target which contains at least 40% carbon, the remainder being substantially silicon. The composite Si—C film obtained has uses in the semiconductor field. Also the Si—C film obtained can be used for its improved trabelogical properties of reduced stress and high hardness compared to known DLC and DC-based films.

In a further particularly preferred embodiment of the invention the method comprises depositing a layer of a composite film of carbon and aluminium, suitably using a target which contains at least 80% carbon, the remainder being substantially aluminum.

The use of composite targets has the advantage that it is possible according to the invention to deposit coatings that have a high proportion of $sp^3$ bonds. It is preferred that the deposited coating has an $sp^3$ content of at least 60%, more preferably at least 70%, and in specific embodiments of the invention $sp^3$ percentages of 80% and above are achievable.

The invention additionally provides in the first aspect a method of depositing a composite coating of at least first and second elements, comprising:

generating an arc between an anode and a cathode target, wherein the cathode target comprises said first and second elements, so as to generate positive ions of said first and second elements; and depositing said ions on a substrate to form the composite coating.

The target used in the method can comprise carbon and the composite coating comprise tetrahedral amorphous carbon having an $sp^3$ content of at least 70%.

In a second aspect of the invention there is provided a composite coating comprising tetrahedral amorphous carbon and a metallic element other than carbon, the composite coating having an $sp^3$ content of at least 60%. The $sp^3$ content in preferred coatings is at least 70%.

In embodiments of the invention a composite coating comprises 99.9–80% carbon and 0.1–20% aluminium. These have been found to exhibit particularly desirable properties as more specifically set out in the examples below.

In further embodiments of the invention a composite coating comprises 99.9–40% carbon and 0.1–60% silicon. These have been found to exhibit particularly desirable properties as more specifically set out in the examples below.

An advantage of films of the invention is that they have stress levels that are reduced compared to pure ta-C films, and therefore films of the invention can be deposited at greater thicknesses than pure ta-C films, but retain an acceptable hardness. In terms of their structure, films of the invention retain a significant proportion of the structure seen in pure ta-C films, such as a high level of $sp^3$ bonding. The films of specific embodiments of the invention have additionally been found to exhibit increased adhesion to substrates and to have a good coefficient of friction. The coatings are of use in applications where such properties are sought, in particular on forming tools, lift frames for semiconductor chips, components of moulds especially injection moulds, dies and punches.

In a third aspect of the invention there is provided a substrate coated with a composite coating according to the second aspect of the invention. It is an advantage of the invention that hard thick coatings are obtainable, and the composite coating typically has a thickness of up to 10 microns.

A still further, fourth aspect of the invention provides a target for use in a cathode arc source, comprising a mixture of carbon and a metallic element other than carbon.

The target may comprises carbon and silicon, and may comprise carbon and aluminum. Targets of this composition have been used in specific embodiments of the invention as described in more detail below, resulting in films have advantageous properties. The target may also comprise carbon and another element, such as a metallic element selected from titanium, chromium, nickel and tungsten.

To obtain a target of the invention, a mixture of carbon and the metallic or other element can be sintered, for example in the presence of a binder such as bitumen or tar.

The invention yet further, in a fifth aspect, provides a method of making a target for use in a cathode arc source, comprising:

combining at least first and second target components in powdered and/or finally divided form to produce a mixture of said first and second target components; and pressing said component to form a target.

The method preferably comprises sintering the mixture of first and second target components at elevated temperature, more preferably at a temperature of 1000° C. or higher.

It is optional to include a binder, in which case the method comprises combining the target components in the presence of the binder, such as tar, bitumen, alcohol and mixtures and compositions thereof.

Clean amorphous silicon-carbon (a-SiC) alloy films were thus deposited in specific embodiments of the invention by filtered cathodic vacuum arc technique. The silicon content in the film was determined by X-ray photoelectron spectroscopy (XPS) measurement and found int examples to vary existence of amorphous silicon carbide clusters in the film with silicon content between 42 and 48 at. %. With increasing silicon content, the hardness of the film decreases from 62 Gpa to 22 Gpa while the compressive stress decreases from 8.2 Gpa to 2.0 Gpa.

Aluminium-containing tetrahedral amorphous carbon (ta-C:Al) films were similarly thus prepared according to the invention in a filtered cathodic vacuum arc process. Characterization of the films was mainly focused on their mechanical properties and internal stress in terms of film structure and Al content. The film structure was studied mainly by MicroRaman Spectroscopy. The mechanical properties were measured by nanoindentation testing. The internal stress was evaluated with a radius of curvature technique by means of surface profilometry. It was noticed that the internal stress of example films was reduced significantly from 10–12 GPa in the ta-C films to 1–2 GPa in the ta-C:Al films. However, the hardness of films had a drop to around 25 GPa when the Al content in the films was beyond 10 at. %. From the Raman measurement, the ratios of D-peak intensity, full width at half height (FWHH) and peak area to those of G-peak slightly increased with the increase of Al content. This indicates that the amount of sp2 bonding in these films has increased. It appears that the increase of sp2 bonding is not considerable. However, with the further increase of Al in the films, the D-peak developed much faster than the G-peak, meaning that the sp2 component has significantly increased and indicating that in films of the invention Al can effectively be doped in the film as an acceptor, and then the $sp^3$ bonding is maintained, and that Al alloying such as $Al_4C_3$ or AlOC can happen when excess Al is introduced into the film. Then Al can exist in clusters in the $sp^3$-dominant carbon network.

BRIEF DESCRIPTION OF THE DRAWINGS

The invention is now illustrated in specific embodiments with reference to the accompanying drawings in which:

FIG. 3 shows the results of measurement of properties of deposited carbon-silicon composite films, namely:

3a shows film stress and hardness as a function of silicon content in the film;

3b shows Raman shift as a function of silicon content in the film;

3c shows variation in silicon content in the film against silicon content in the target;

3d shows stress against hardness in silicon-carbon composite films;

3e shows hardness and Young's modulus as a function of silicon content in the films;

FIG. 6 shows hardness and Young's modules as a function of aluminium content in the films. The data illustrated in FIG. 6 are derived from separate data illustrated in FIGS. 7 and 8. FIG. 6 shows the variation of hardness and the Young's modules verses compressive stress for ta-C:Al at different Al contents. It indicates that for low compressive stress coatings, higher Al compositions are needed ranging from 5.0 at. % Al to 15.0 at. % Al. With these higher Al compositions, coatings with relatively high hardness and low compressive stress are obtained;

FIG. 7 shows hardness as a function of aluminium content at a substrate bias of −80V; and FIG. 8 shows stress against hardness in aluminium-carbon composite films.

EXAMPLE 1

The amorphous silicon-carbon alloy films were deposited by a FCVA system described elsewhere. Carbon and silicon ions are produced in a vacuum arc discharge between the cathode and the grounded anode. The cathode is a 60 mm diameter target mounted on a water-cooled stainless-steel block. Pure graphite and silicon powder (325 mesh) with different atomic fractions were mixed thoroughly and compressed to cylinder shaped targets by a pressure of 770 MPa. The arc current was kept constant at 90 A. A toroidal magnetic field around 40 mT was employed to produce the axial and curvilinear fields to steer the plasma. All depositions were carried in floating condition at room temperature and with vacuum pressure less than $10^{-6}$ Torr. The substrate was clean (100) n-type silicon with average thickness of 0.5 mm. XPS measurement was carried out on a VG Scientific Microlab 310F system using a Mg Ka (1253.6 eV) as the x-ray source. The Raman spectra were excited using the 514.5 nm line of an Ar$^+$ laser and collected with back scattering on a CCD camera using a Renishaw micro-Raman System 1000 spectrometer. The film stress was determined by a surface profilometer (Tencor P10) with the radius-of-curvature method. The hardness of the film was measured by an indenter (Nano-Indenter® II) operated in a constant-displacement-rate continuous stiffness mode.

Figure 1:
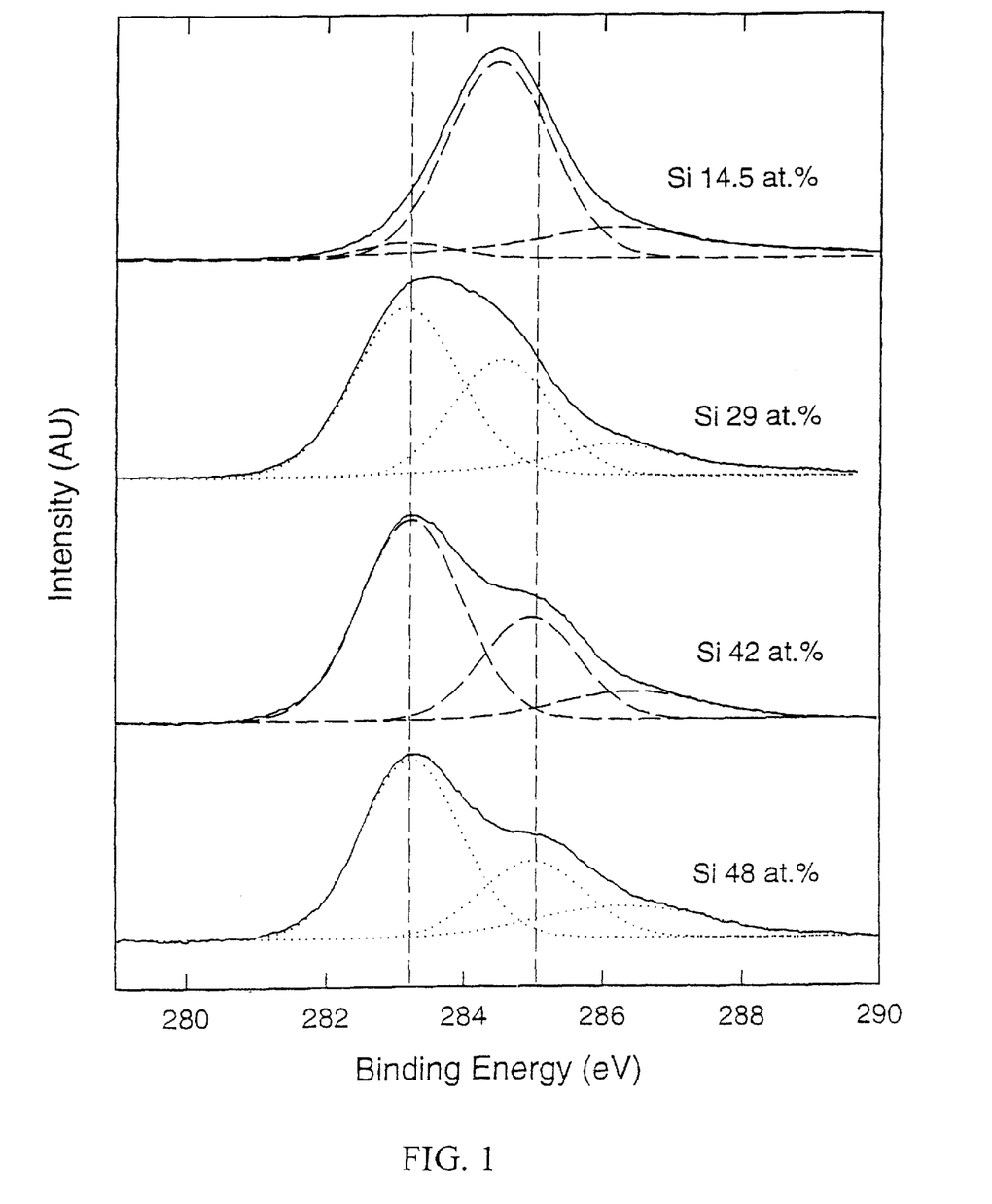
FIG. 1 shows deconvoluted C 1s XPS spectra for amorphous silicon-carbon alloy films with different silicon contents.

All the silicon-carbon alloy films exhibit a clean and smooth morphology with RMS roughness smaller than 0.6 nm over an image area of 1 $\mu m^2$. The silicon contents (Si/(Si+C)) in the films determined by XPS measurement are 2.4, 14.5, 29, 42 and 48 at. %, while the silicon contents in the targets are 1, 5, 10, 20 and 30 at. %, respectively. The larger silicon content in the film compared with in the corresponding target may be resulted from the lower melting point of silicon compared with graphite. FIG. 1 shows the XPS narrow scan of C 1s peak for amorphous silicon-carbon alloy films. The C 1s peak was deconvoluted into three components located at 283.2, 284.5 (285.0) and 286.3 eV, which are attributed to C—Si, C—C and C—O (contamination) bonds, respectively. The C—C bond is located at 284.5 eV for the films with 14.5 and 29 at. % silicon, but at 285.0 eV for the films with 42 and 48 at. % silicon. It was observed that the C 1s peak for ta-C films contains a sp$^3$ C—C bond at 285.4 eV and a sp2 C—C bond at 284.3 eV. The higher C—C bond position for the present films with 42 and 48 at. % silicon indicates a higher fraction of sp$^3$ bonded carbon. As the silicon content increases, the peak area of the C—Si bond increases. In the films with 14.5 at. % silicon, the C—C bond is the main bond for carbon atom. In the films with 42 and 48 at. % silicon, the C—Si bond becomes the dominant bond. The Si 2p peak (not shown) was deconvoluted into a big component at 100.5 eV and a small component at 102.7 eV. The former is attributed to Si—C bond, and the later is to Si—O bond. The Si—C bond is predominant in the Si 2p peak for all films with different silicon contents.

Figure 2:
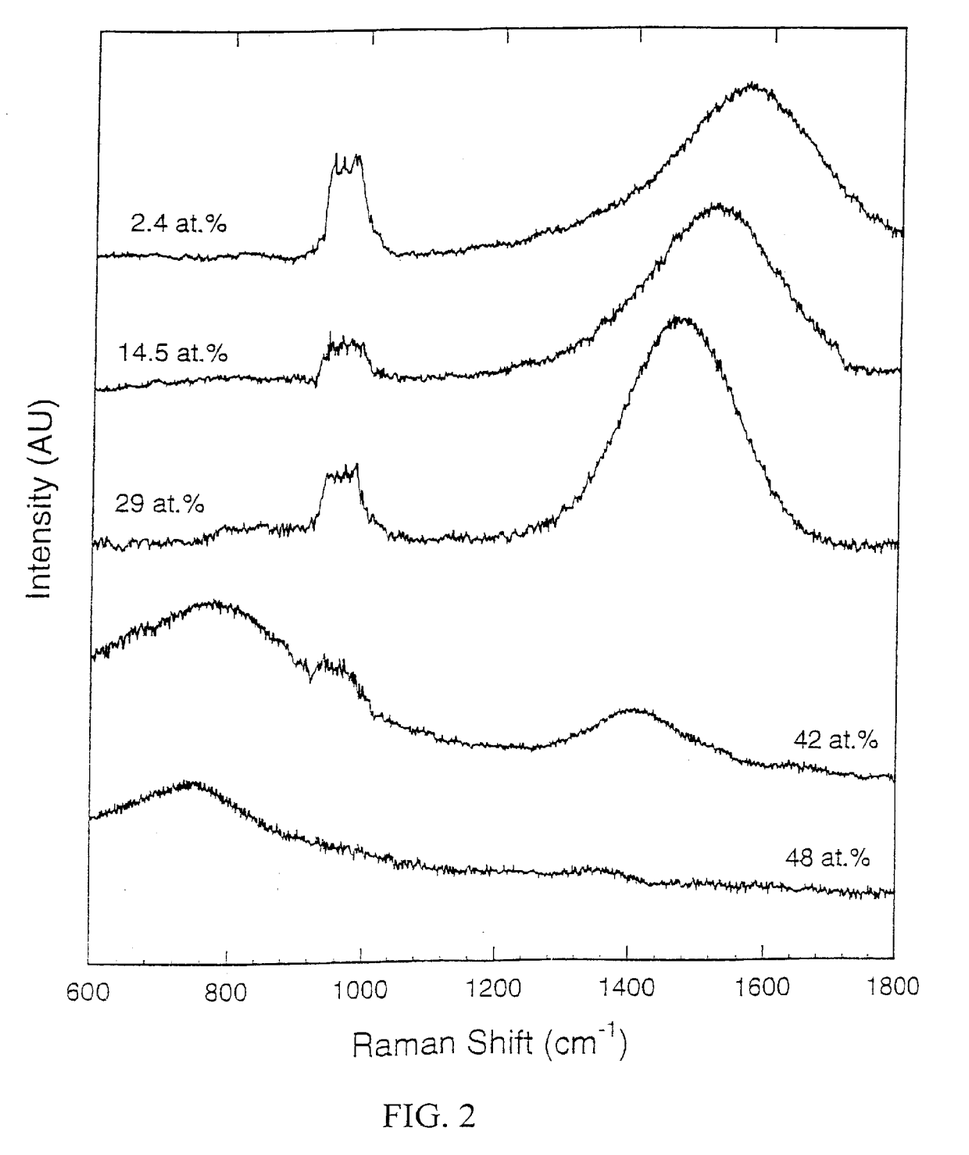
FIG. 2 shows Raman spectra of amorphous silicon-carbon alloy films with different silicon contents.
Figure 3A:
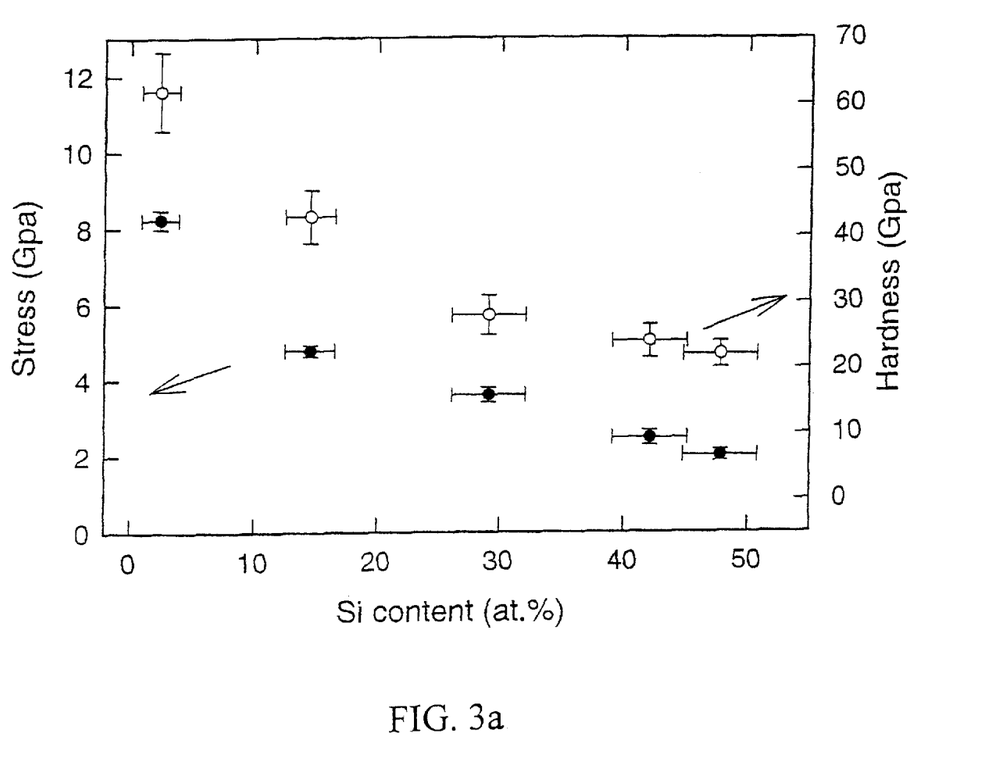
Figure 3B:
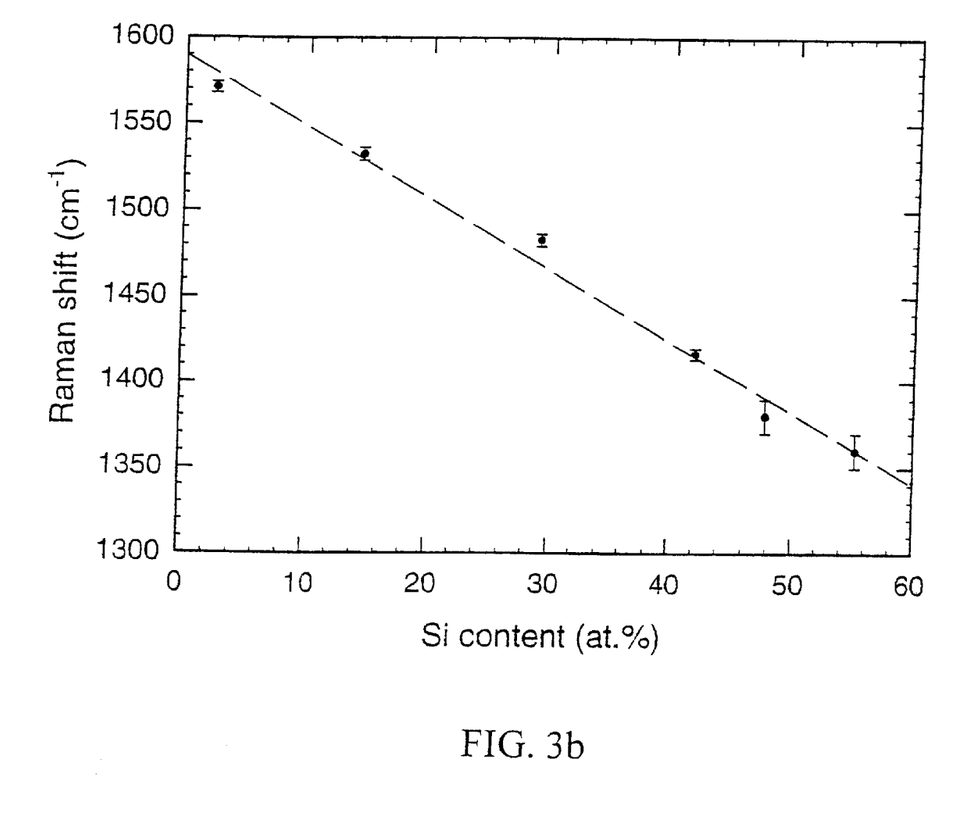
Figure 3C:
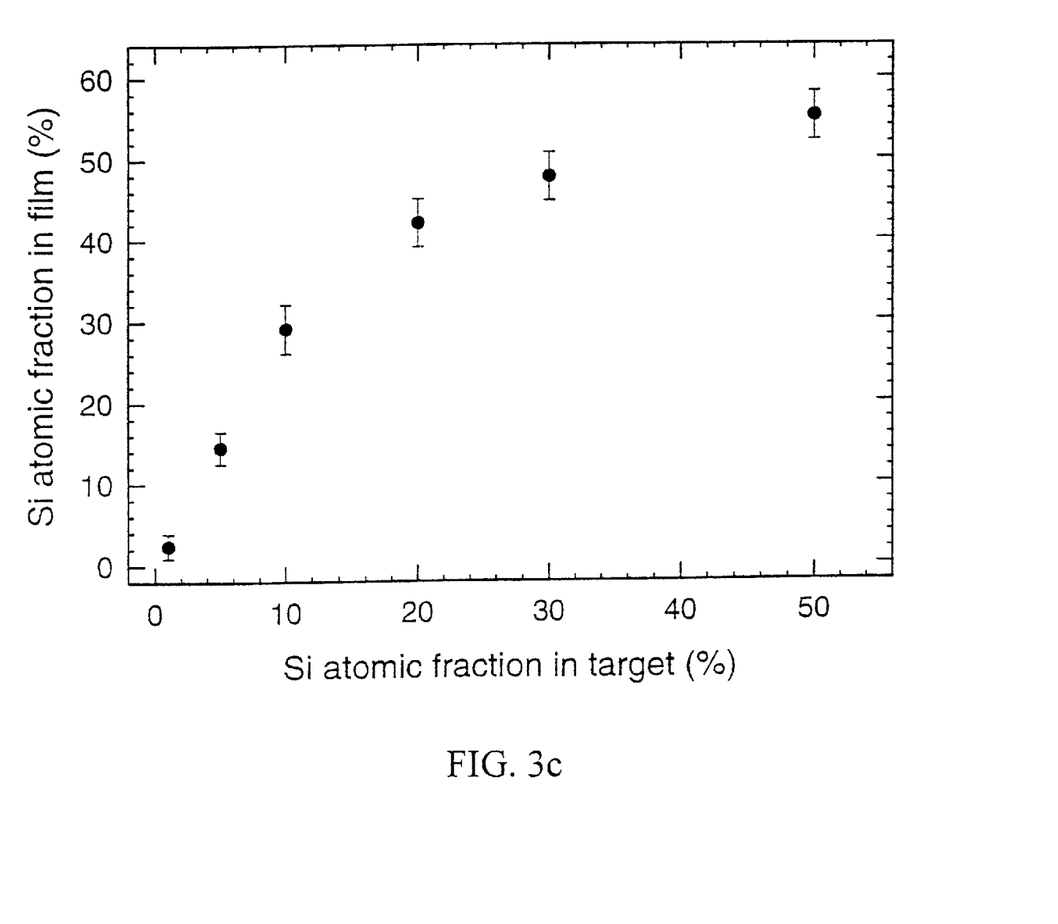
Figure 3D:
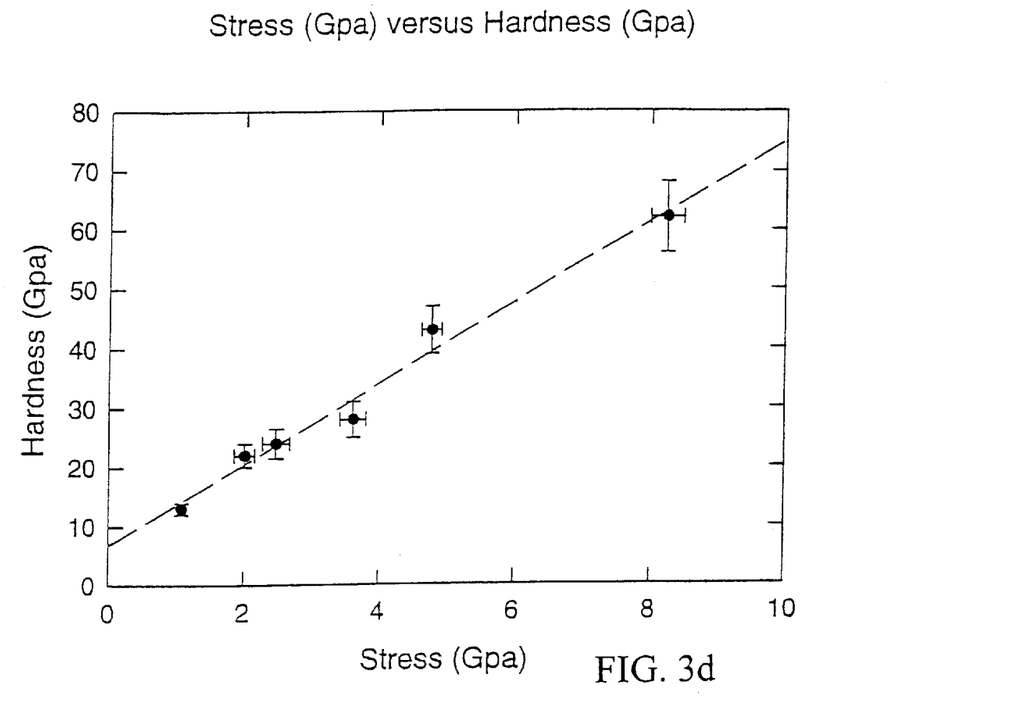
Figure 3E:
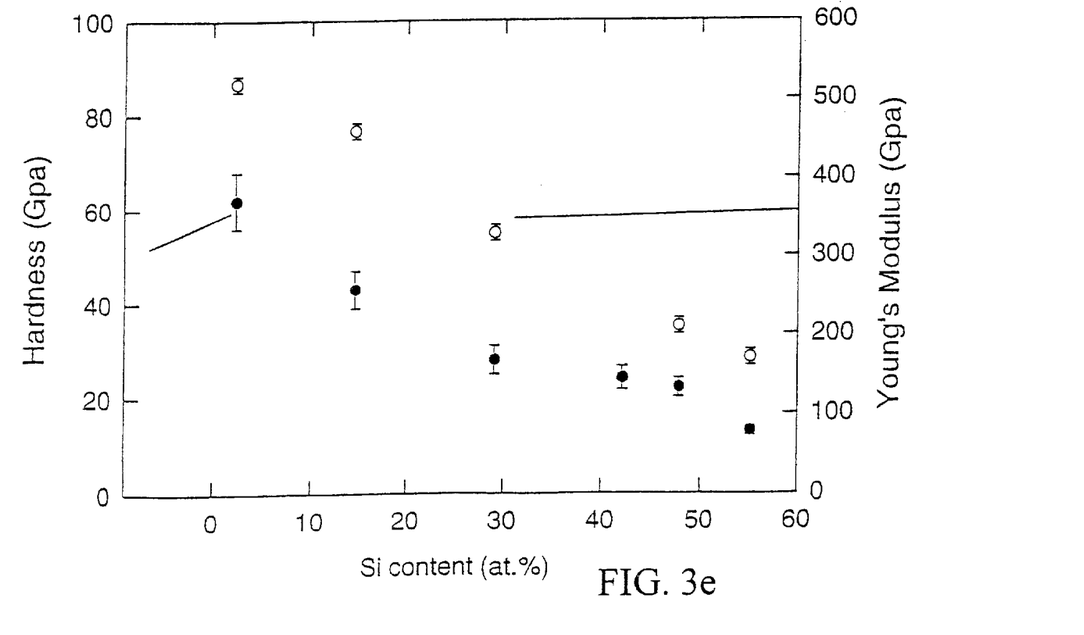

The Raman spectra for the films with different silicon contents are shown in FIG. 2 in the range of 600 to 1800 cm$^{-1}$. The spectra have been displaced vertically for clarity. For the films with silicon content from 2.4 to 29 at. %, a broad band predominates in the range of 1400–1700 cm$^{-1}$, and a wide peak appears around 950 cm$^{-1}$. The former peak is due to the vibrational mode of amorphous carbon clusters (Schwan et al 1996) and the later is the second order Raman vibrational modes of silicon substrate. For films with silicon content of 42 and 48 at. %, a broad band appears in the range of 600–900 cm$^{-1}$, which is considered as the vibrational mode of the amorphous silicon carbide cluster (Zhang et al 1998, Kumbhar et al 1995). The broad peak in the range of 1400–1700 cm$^{-1}$ was fitted with two Gaussian peaks defined as the graphite ("G") and disorder ("D") peaks, respectively. The fitting shows a big G peak and a small D peak. The G position almost linearly decreases from 1571 cm$^{-1}$ for the film containing 2.4 at. % silicon to 1416 cm$^{-1}$ for the film containing 42 at. % silicon. It could be a good indicator for the film composition. For the films containing 48 at. % silicon, the Raman band of the carbon cluster appears around 1370 cm$^{-1}$ and becomes very weak. The great decrease of the G position of the carbon cluster is qualitatively explained as following. At low silicon concentration, the silicon atom predominately substitutes the carbon atom. As the atomic fraction of silicon in the film increases, more and more silicon atoms substitute the carbon atoms into the ring shaped sp$^2$-bonded carbon cluster. As the silicon atom is heavier than the carbon atom and Si—C bond is weaker than C—C bond, the vibration energy of stretching mode of the ring becomes lower and lower.

For the film containing 42 at. % silicon, a strong broad peak due to the amorphous silicon carbide cluster appears around 790 cm$^{-1}$. For the film containing 48 at. % silicon, this peak is centred at 750 cm$^{-1}$. The appearance of the wide peak around 750–790 cm$^{-1}$ suggests that there are separated silicon carbide clusters in these films. IR absorption measurement of amorphous silicon-carbon films deposited by hot-filament assisted CVD method (Kumbhar et al 1995) showed that the absorption peak corresponding to Si—C vibration shifts from 760 to 800 cm$^{-1}$ as the silicon content decreases. This is in good agreement with our result. The higher peak position for the film with 42 at. % silicon may be resulted from that the amorphous silicon carbon clusters are still carbon rich.

With increasing silicon content, the internal compressive stress of the film decreases monotonously from 8.2 Gpa for the film with 2.4 at. % silicon to 2.0 Gpa for the film with 48 at. % silicon (FIG.3). The highest stress 8.2 Gpa is very near the value of pure ta-C film. A stress of below 2.5 Gpa in the film with 42 and 48 at. % silicon enables to deposit thick films with a thickness over 500 nm. The hardness shows almost similar behaviour as the internal stress, decreasing from 62 GPa for the film with 2.4 at. % silicon to 22 Gpa for the film with 48 at. % silicon. Quite high hardness for the films with 42 and 48 at. % silicon (24 and 22 Gpa) may be due to the existence of amorphous silicon carbide cluster and the subplantation deposition mechanism of FCVA technique.

Hydrogen-free clean and hard amorphous silicon-carbon alloy films have been successfully deposited according to the invention. Both XPS and Raman spectroscopy show the existence of silicon carbide cluster in specific films with silicon content between 42 and 48 at. %. The silicon atoms predominately substitute the carbon atoms into the carbon cluster at low silicon concentration, and form amorphous silicon carbide cluster at a higher silicon concentration.

EXAMPLE 2

The ta-C:Al films were deposited in a filtered cathodic vacuum arc (FCVA) process. The FCVA system has been addressed elsewhere(Shi et al 1996). The mixed aluminum/graphite (Al/C) targets were used in place of pure graphite target during deposition. The Al/C targets with the varying Al content were made of Al and graphite powders under a pressure of 0.6 GPa. The ta-C:Al films were deposited at a bias of −80 V. In the FCVA process, the ionized atoms produced from the target in the vacuum chamber ($10^{-4}$~$10^{-7}$ Torr) were accelerated through a mechanical-electrical-magnetic filtering bend towards the substrate and further deposited on the substrate. Undoped, n-type <100> silicon wafers were used as the substrates. The wafers were first cleaned in detergent liquid and then in deionized water using an ultrasonic machine before entering the vacuum chamber. The substrate surface was further cleaned by Ar ion bombardment in the vacuum chamber prior to deposition. The wafer surface was then coated a layer of ta-C:Al film. All the depositions were carried out at the room temperature.

A micro-Raman spectroscope (Ramascope, Renishaw) with 514.5 nm Ar laser was used to characterize the film structure. The laser output power was 10 mW. A filter of 50% was also used. The laser beam was focused on the sample surface using an optical microscope with a magnification of 50×(laser spot size~1 μm). The Raman spectra were acquired in the range of 1100 $cm^{-1}$ and 1900 $cm^{-1}$ to evaluate the differentiation of structures of ta-C:Al films in terms of the first-order D and G peak positions, and the ratios of peak amplitudes, full width at half maximums (FWHM), and integrated peak areas between the corresponding D and G peaks.

Atomic force microscopy (AFM) (S-3000, Digital Instruments) and surface profilometry (Tencor P-10) were used to measure the surface morphological characteristics of films.

SEM/EDX and XPS were used to analyze the Al content in the ta-C:Al films.

The wear and scratch tests were also performed on the ta-C:Al films using a pin-on-disc tribometer (CSEM) and a microscratch tester (CSEM), respectively.

The micro-Raman spectroscopy is a non-destructive method for measuring the bonding structure of the materials. Since the 514.5 nm laser light is more sensitive to the $sp^2$ carbon bonding, the $sp^2$ contribution is always explicit in the Raman spectrum. Consequently, the Raman spectrum of the ta-C films is dominated by the G peak at about 1550 $cm^{-1}$ and the D peak at around 1350 $cm^{-1}$, both of which are attributed to the $sp^2$ bonding.

Figure 4A:
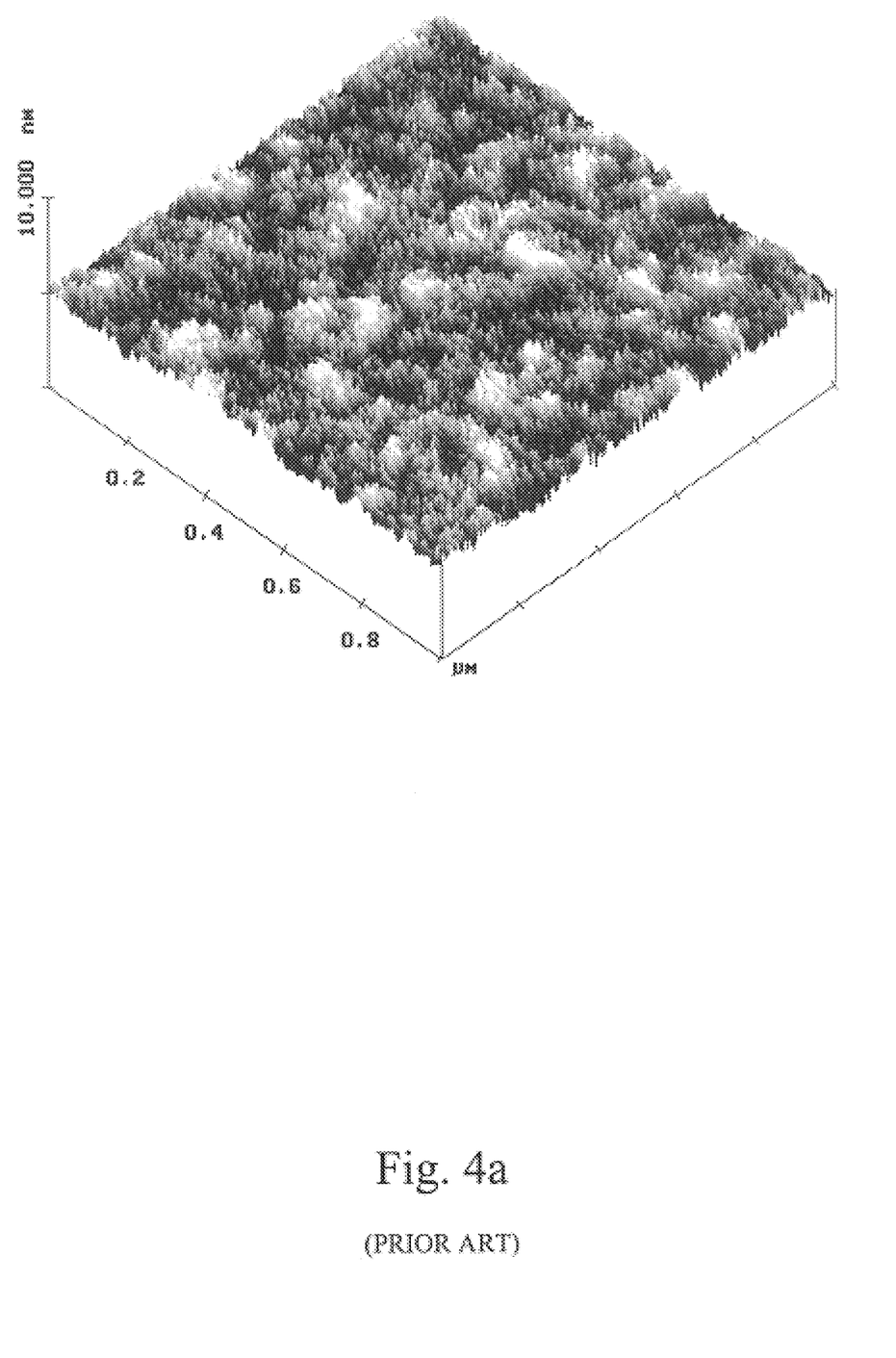
FIG. 4 shows a surface morphology of films: (a) ta-C film (prior art); and (b) ta-C:Al film deposited using a C/Al target containing 5 at. % Al.
Figure 4B:
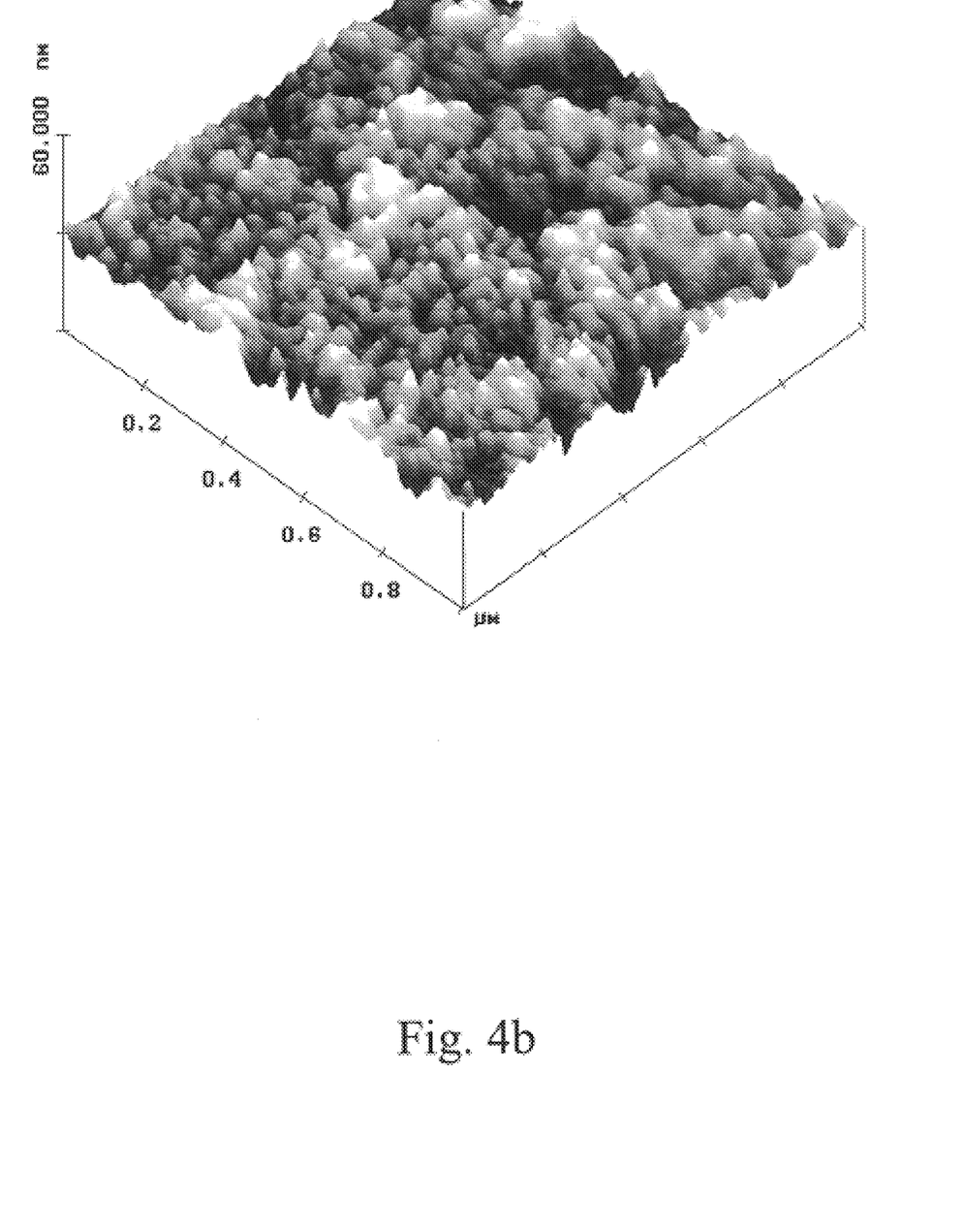

FIG. 4 shows the AFM images of surface morphology of ta-C and ta-C:Al films, where the ta-C films were deposited at a bias of −80 V and the ta-C:Al films were grown using a C/Al mixed target containing 5 at. % Al. It can be seen that the ta-C film contains fine asperities. The particle size of ta-C:Al film comes larger. It is hypothesized that the fine particles in the ta-C film are due to a large percentage of $sp^3$ carbon bonding formed by the high impinging carbon energies. For the ta-C:Al films, the content of $sp^2$ bonding has appreciably developed due to the high Al content in the films, which leads to the relatively large particles in the films.

The Raman spectrum results from inelastic scattering of photons. The total intensity of a Raman signal depends on Raman scattering cross sections, beam geometry, excitation power, detection efficiency.

Typically in the ta-C films, the predominant component is $sp^3$ bonded carbon together with certain $sp^2$ bonded carbon clusters. The Raman phonon lines are more sensitive to the $sp^2$ carbon bonding due to its larger Raman scattering cross-section. The Raman spectra for the films in this study give a broad band overlaid by G and D peaks as shown in FIG. 5.

For the Al containing films, both the G and the D positions shift to the lower frequencies with the increase of Al content. This trend may be caused by the Al induced stress release or by the excess Al content. Another study has shown that the internal stress has been reduced from 10–12 GPa for the ta-C films to 1 to 2 GPa for the film deposited with a Al/C target containing 15 at. % Al. Ager III et al. have reported a G peak shift of about 20 $cm^{-1}$ on a ta-C film deposited at −100 V bias when comparing the strained film with the free standing film. However, the G peak shift is up to about 90 $cm^{-1}$ for the Al containing ta-C films in this study. It is therefore inferred that the G peak position shift is not only induced by the internal stress release.

The ratio of the intensity of D peak to the intensity of G peak can be used to reflect the extent of graphitization of the DLC films, i.e. the ratio $I_D/I_G$ increases as the amount of the $sp^2$ bonded clusters in the $sp^3$ bonded matrix increases. (assuming that the intensity of the G peak remains relatively unchanged).

Figure 5:
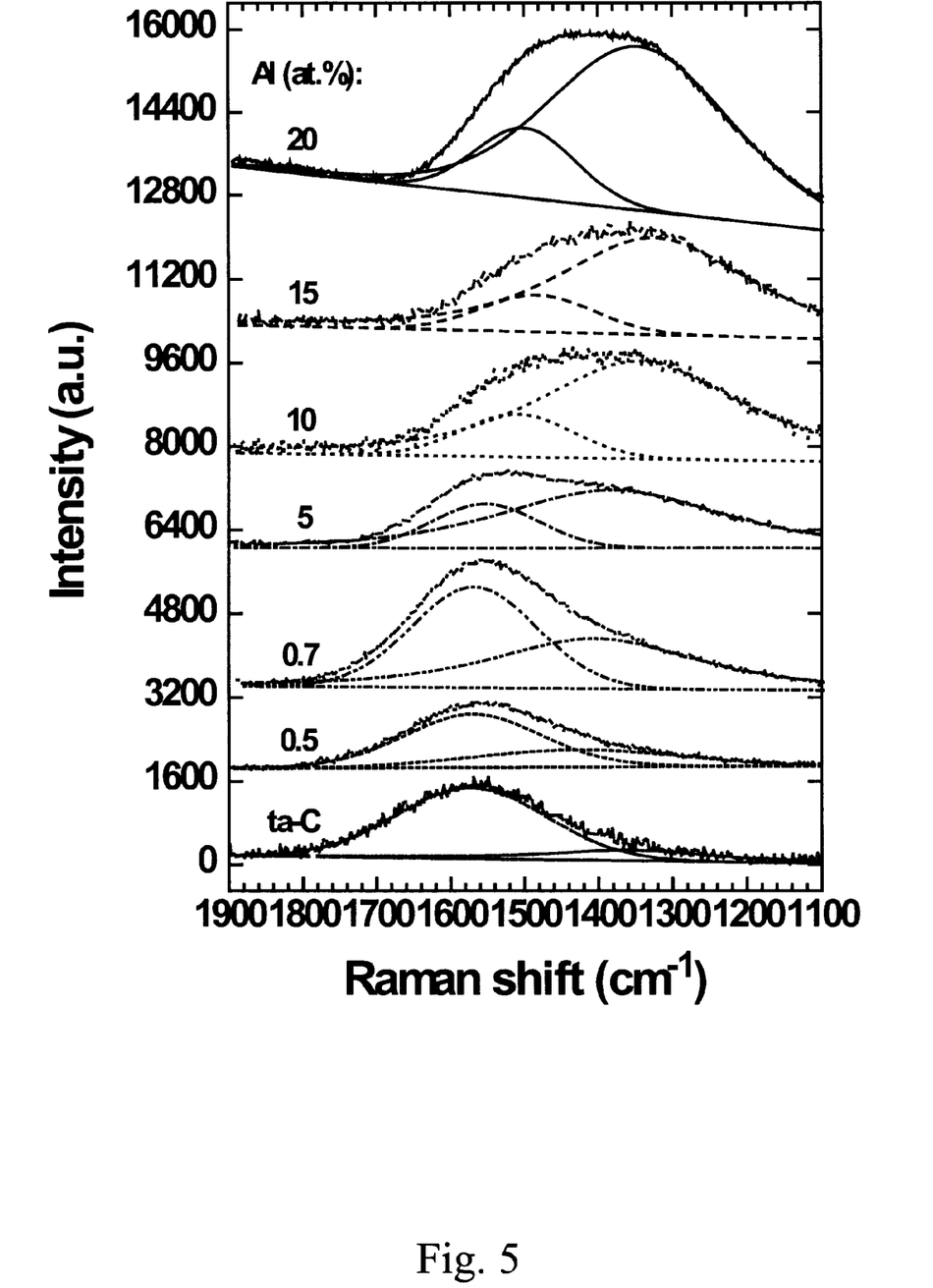
FIG. 5 shows Raman shift against aluminium content of carbon-aluminium composite films.
Figure 6:
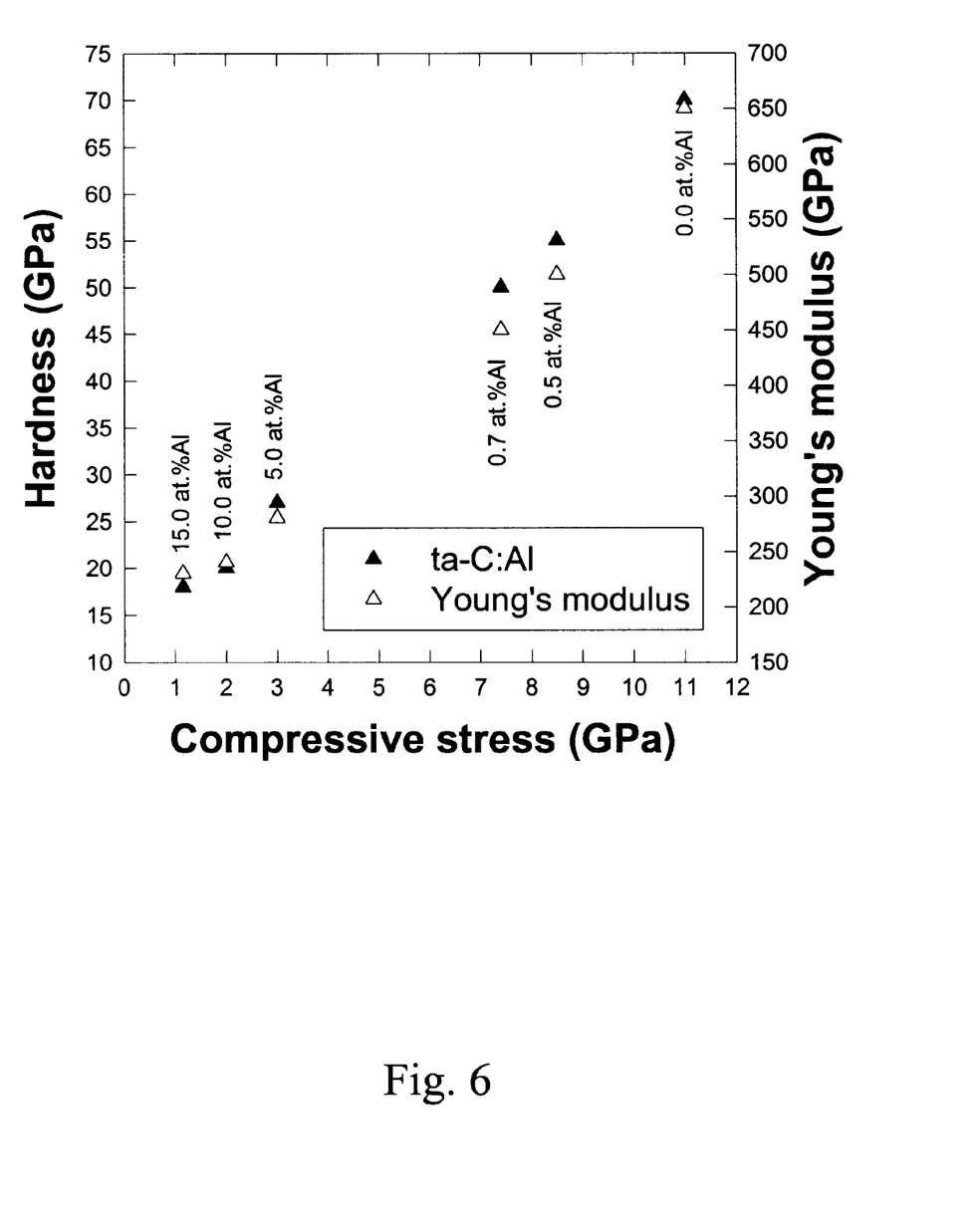
FIGS. 6–8 show the results of measurement properties of deposited carbon-aluminium composite films, namely.

FIG. 5 shows the position of the D and G peaks as the aluminum content is varied in the films. The graph shows that both peaks change in position as the aluminum content in the film is increased. The D peak shifts from 1406 $cm^{-1}$ to 1327 $cm^{-1}$ when the Al content is increased from 0.7 at. % to 15 at. %. The G peak shifts from 1569 $cm^{-1}$ to 1487 $cm^{-1}$.

For the peak intensity and area ratios, the measurements indicate that both are increasing as the content of aluminum increases. To explain the phenomenon, we propose to classify the clusters into two categories, one ranging from atoms to nanoclusters and the other from nanoclusters to macroparticles.

The shift of G peak position to a lower frequency can be used to estimate the reduction of the compressive stress as aluminum is introduced into the films. The hypothesis for this estimation is that the vibrational frequency in a material is proportional to its interatomic forces between the atoms. If the material is strained the spacings between the atoms change correspondingly, which further results in the change in the vibrational frequency.

Figure 7:
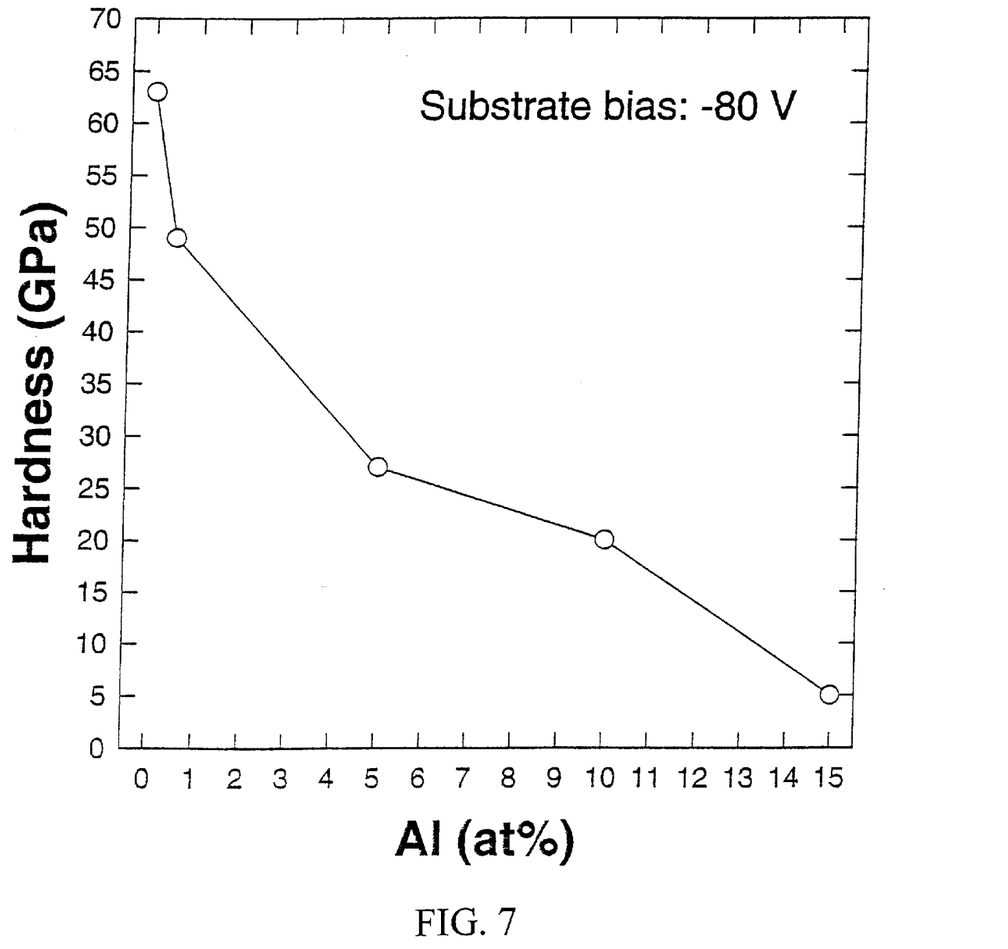
Figure 8:
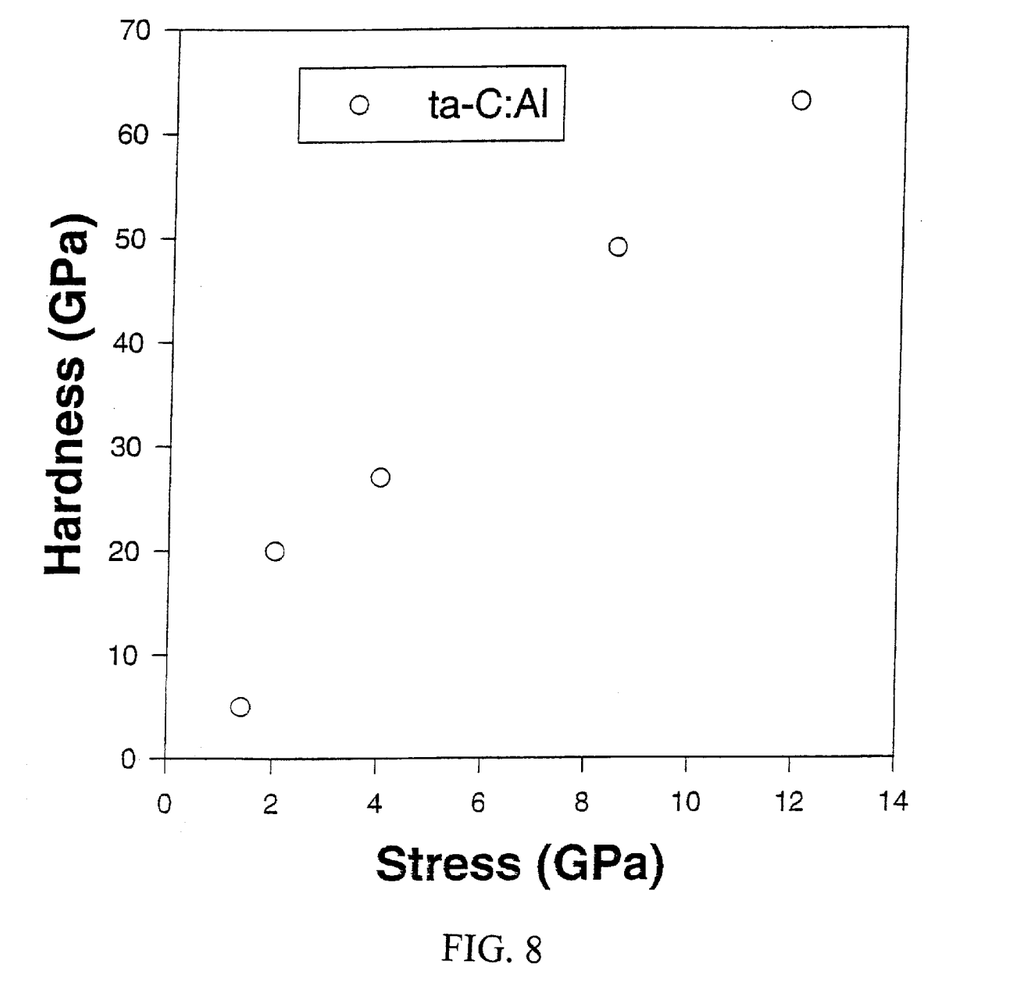

The shift of the D peak position to a lower frequency may be due to the further increase of the degree of disorder of the $sp^2$ bonded clusters. The bond angles of the bonds in the clusters get also further distorted and the bond lengths increase, which weaken the bond strength. This gives rise to the lowering of the D peak position. The increase in disorder also means that the size of the clusters is reducing while the intensity of the D peak increases and the intensity of the G peak decreases. This implies that the ratio of peak intensities of D and G peaks should increase as the amount of aluminum increases (FIG. 7a).

The increase in the D peak intensity may also be related to the relative increase in the amount of $sp^2$ bonded clusters embedded in the $sp^3$ bonded matrix in the ta-C:Al films. The differentiation in the ratio of FWHMs is relatively small compared to the other two ratios.

The normal ta-C films are composed of the $sp^3$ bonded carbon matrix with the segregated $sp^2$ bonded carbon clusters. By introducing aluminum, it is expected that more doubly bonded carbon clusters or even Al clusters may be created to release the compressive internal stresses in the films in expense of amount of the tetrahedral bonds. The Al clusters are also expected to absorb some strain in the film.

From the Raman measurement, the ratios of D peak intensity, FWHM and peak area to those of G peak slightly increase with the increase of Al content. It means that the amount of $sp^2$ bonding in these films has relatively increased. With a small Al content, the increase of amount of $sp^2$ bonding appears to be not appreciable. However with a relatively high Al content in the film, the D peak develops faster than the G peak. It means that the $sp^2$ component in the ta-C:Al films containing more Al has considerably increased relative to the $sp^3$ component. Two hypotheses are therefore proposed. The first one is that the amount of tetrahedral bonding may be maintained less changed as the Al content is small. The Al atoms may also partially act as the electron acceptors forming the doped structures. The second is that the Al atoms in the film may react with C to form Al/C compounds or exist in the Al clusters when the excess Al is introduced into the film, which is being investigated.

There was a tendency that the ratios of intensities, FWHMs and peak areas between D and G peaks first decreased and then increased with the increase of substrate bias during deposition. The minimum ratios were obtained at a bias around −80 V, which corresponds to the maximum $sp^3$ content in the ta-C films.

For the ta-C:N films, the ratios first slowly increased with the increase of $N_2$ partial pressure when the $N_2$ partial pressure was lower than $1 \times 10^{-4}$ Torr, and then increased relatively fast with the increase of $N_2$ partial pressure when the $N_2$ partial pressure was higher than $1 \times 10^{-4}$ Torr. The amount of $sp^2$ component may become much higher when the $N_2$ partial pressure is higher than $1 \times 10^4$ Torr.

For the Al containing films, both the G and the D peak positions shifted to the lower frequencies with the increase of Al content. The peak intensity and area ratios increased as the content of aluminum increased. The differentiation in the FWHM ratio was relatively small compared to the other two ratios. More doubly bonded carbon clusters or even Al clusters may be created in expense of amount of the tetrahedral bonds. The Al clusters were also expected to absorb some strain in the film. It is proposed that the amount of tetrahedral bonding in the films may be maintained less changed as the Al content was small. The Al atoms in the film may react with C to form Al/C compounds or exist in the Al clusters when the excess Al was introduced into the film.

References:

D. R. McKenzie, D. Muller, and B. A. Pailthorpe, Phys. Rev. Lett. 67, 773 (1991).

P. J. Fallon, V. S. Veerasamy, C. A. Davis, J. Robertson, G. A. J. Amaratunga,

W. I. Milne, and J. Koskinen, Phys. Rev. B 48, 4777 (1993).

P. J. Martin, S. W. Filipczuk, R. P. Netterfield, J. S. Field, D. F. Whitnall, and D. R. McKenzie, J. Mater. Sci. Lett. 7, 410 (1988).

Shi Xu, D. Flynn, B. K. Tay, S. Prawer, K. W. Nugent, S. R. P. Silva, Y. Lifshitz, and W. I. Milne, Philo. Magaz. B 76, 351 (1997).

X. Shi, D. Flynn, B. K. Tay, and H. S. Tan, Filtered Cathodic Arc Source (patent) PCT/GB96/00389 (1995).

X. Shi, M. Fulton, D. Flynn, B. K. Tay, and H. S. Tan, Deposition Apparatus (patent) PCT/GB96/00390 (1995).

J. Schwan, S. Ulrich, V. Batori, H. Ehrhardt, and S. R. P. Silva, J. Appl. Phys. 80, 440 (1996).

X. Zhang, W. H. Weber, W. C Vassell, T. J. Potter, and M. A. Tamor, J. Appl. Phys. 83, 2820 (1998).

A. S. Kumbhar, D. M. Bhusari, and S. T. Kshirsagar, Appl. Phys. Lett. 66, 1741 (1995).

Shi Xu, B. K. Tay, H. S. Tan, Li Zhong, Y. Q. Tu, S. R. P. Silva, and W. I. Milne, J. Appl. Phys. 79, 7239 (1996).

H. Dimigen, H. Hubsch, and R. Memming, Appl. Phys. Lett. 50, 1056 (1987).

Q. Wei, R. J. Narayan, J. Narayan, J. Sankar, A. K. Sharma, Mater. Sci. Eng. B 53, 262 (1998).

What is claimed is:

1. A method of applying a coating to a substrate using a filtered cathode arc source, comprising:

generating an arc between a cathode target and an anode of the source; and depositing positive target ions on the substrate to form a coating, wherein the coating is a composite of at least carbon and a second element other than carbon, and the target comprises said at least carbon and said second element.

2. A method according to claim 1 wherein the coating is a composite further comprising a third element and the target further comprises said third element.

3. A method according to claim 1, wherein the target comprises said carbon and said second element, and wherein the method further comprises introducing a element into the coating in a gaseous or liquid form.

4. A method according to claim 1 wherein the coating is a composite coating comprising tetrahedral amorphous carbon.

5. A method according to claim 1 wherein the second element is selected from the group consisting of titanium, nickel, chromium, aluminum, silicon, and tungsten.

6. A method according to claim 4 wherein the target contains at least 40 atomic % carbon, the remainder being substantially silicon.

7. A method according to claim 4 wherein the target comprises at least 80 atomic % carbon, the remainder being substantially aluminum.

8. A method according to claim 4 wherein the composite coating has an $sp^3$ content of at least 60%.

9. A method according to claim 8 wherein the coating has an $sp^3$ content of at least 70%.

* * * * *